United States Patent
Kegel et al.

(10) Patent No.: US 6,706,616 B1
(45) Date of Patent: Mar. 16, 2004

(54) METHOD FOR IMPROVING THERMAL PROCESS STEPS

(75) Inventors: Wilhelm Kegel, Langebrueck (DE); Thomas Schuster, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/914,749

(22) PCT Filed: Mar. 2, 2000

(86) PCT No.: PCT/DE00/00655

§ 371 (c)(1),
(2), (4) Date: Jan. 14, 2002

(87) PCT Pub. No.: WO00/52748

PCT Pub. Date: Sep. 8, 2000

(30) Foreign Application Priority Data

Mar. 4, 1999 (DE) .......................................... 199 09 564

(51) Int. Cl.$^7$ ............................................... H01L 21/76
(52) U.S. Cl. ....................... 438/452; 438/762; 438/763
(58) Field of Search ..................... 438/452, 762–763, 438/770–773, 443, 439, 297, 305, 689, 778, 769, 783

(56) References Cited

U.S. PATENT DOCUMENTS 5,637,528 A   6/1997   Higashitani et al. ........ 438/452
5,972,779 A * 10/1999  Jang ........................... 438/452

FOREIGN PATENT DOCUMENTS

WO       99 03141      1/1999    ......... H01L/21/316

OTHER PUBLICATIONS

Moslehi, M.M., "Single–wafer optical processing of semiconductors: Thin insulator growth for intgrated electronic device applications", Applied Physics A (Solids and Surfaces), Aug. 1988, vol. A46, No. 4, pp. 255–273.

Internation Search Report.

* cited by examiner

*Primary Examiner*—David Nelms
*Assistant Examiner*—Dung Le
(74) *Attorney, Agent, or Firm*—Fish & Richardson P.C.

(57) ABSTRACT

A method for controlling temperature of a semiconductor wafer in a process chamber includes heating the chamber from a starting temperature to a stabilizing temperature at a heating rate of approximately 12 degrees Celsius per second and maintaining the chamber at the stabilizing temperature for a selected stabilization period. The chamber is then heated from the stabilizing temperature to a process temperature at a heating rate of approximately 10 degrees Celsius per second. This process temperature is maintained for a selected processing period. After the period, the chamber is cooled to an exit temperature at a selected low cooling rate.

13 Claims, 1 Drawing Sheet

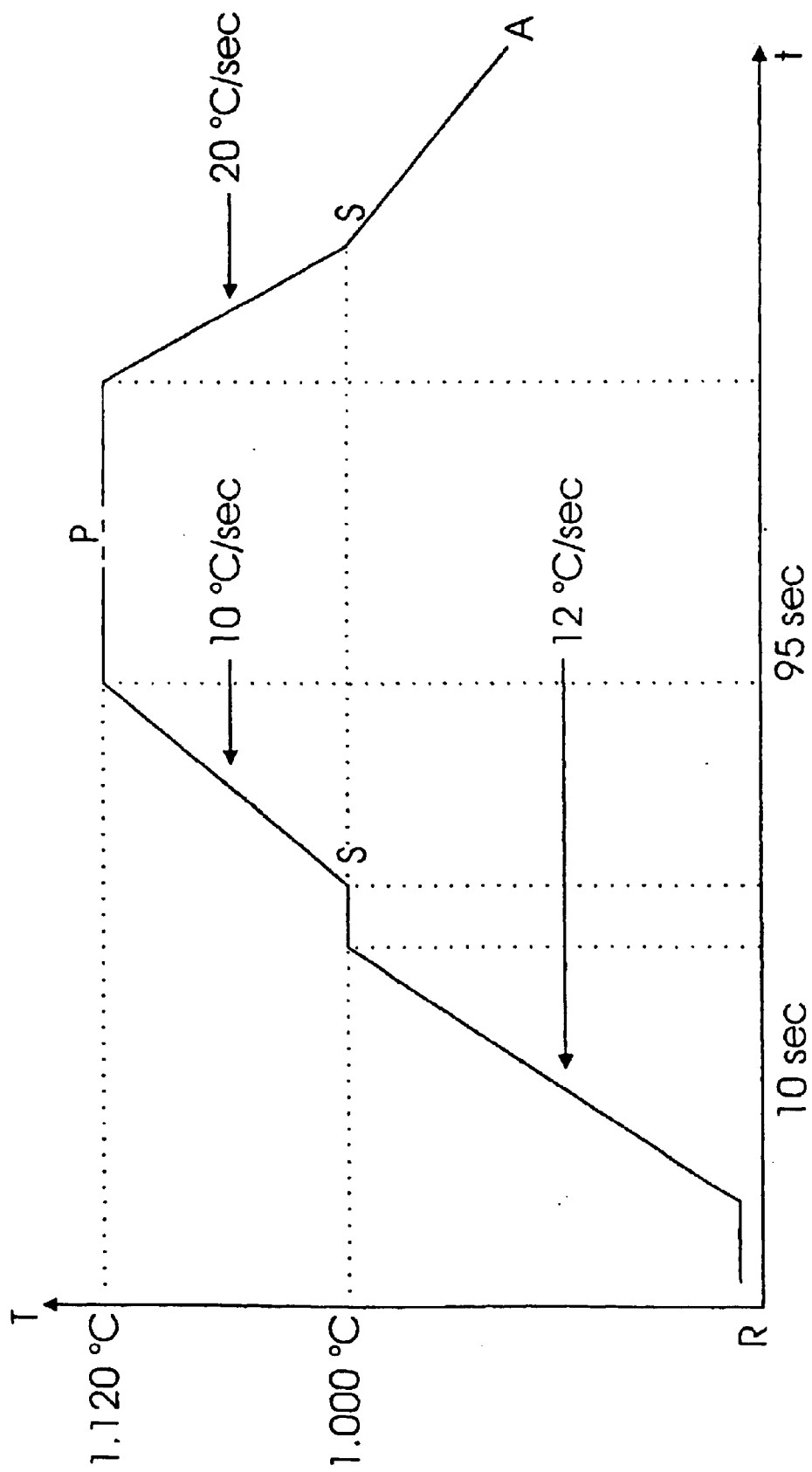

METHOD FOR IMPROVING THERMAL PROCESS STEPS

FIELD OF INVENTION

The invention relates to a method for improving thermal process steps in the patterning of semiconductor wafers, in particular in rapid thermal processing (RTP) processes preferably during AA (active area) oxidation, sacrificial oxidation, and GC (gate conductor) sidewall oxidation.

BACKGROUND

The oxides produced in these process steps are used, on the one hand, as screen oxides for the well implantations and, on the other hand, as an intermediate layer for reducing mechanical stress. The oxidation steps take place in a process chamber at relatively high process temperatures, with the result that the wafers are exposed to considerable thermal loading during these process steps, in particular in the case of high heating and cooling rates. The wafers are heated up to a stabilization step at 750° C., for example at 50° C./sec, and then up to the process temperature at a heating rate of 46° C./sec in the case of AA oxidation. The cooling rate may be 50° C./sec in the upper temperature range.

What are problematic are, in particular, the RTP processes in AA oxidation, sacrificial oxidation and in GC sidewall oxidation. The integrated gate stack, in particular, reacts sensitively to high heating rates.

The thermal loading occurring in this case can lead to lateral wafer distortions which result in uncorrectable positional errors of the structure planes lying one above the other, in particular of the contact hole planer. Positional errors above the other, in particular of the contact hole planes. Positional errors of this type did not occur with the hitherto customary structure widths of significantly more than 0.25 mm and the wafer material used.

With technologies of 0.25 mm for large scale integrated memory components, such positional errors in the contact hole planes, which also lead to DC yield losses, are no longer acceptable and can lead to significant losses of yield or even to the total functional incapability of entire batches.

SUMMARY

The invention is therefore based on the object of providing a method for improving thermal process steps in which the disadvantages described above are avoided.

In the case of a method of the type mentioned in the introduction, the formulation of the object on which the invention is based is achieved by virtue of the fact that the wafer is heated at a heating rate of approximately 12° C./sec up to a brief stabilization step at constant temperature and then up to the envisaged process temperature at a heating rate of 10° C./sec and, after the process time has elapsed, is cooled down to room temperature at a predetermined low cooling rate.

The stabilization step is preferably raised to a temperature of 120° C. below the process temperature and is 1000° C., for example.

With the reduction of the heating rate and the shifting of the stabilization temperature from hitherto 750° C. to 120° C. below the process temperature, the temperature response is homogenized over the wafer. As a result, wafer distortions no longer occur. oxidation processes, i.e. during AA oxidation, sacrificial oxidation and GC sidewall oxidation.

In a continuation of the invention, the wafer is cooled at a cooling rate of approximately 20° C./sec in the high-temperature range. This prevents wafer distortions from being able to occur during cooling.

Preferably, the wafer, at least in the temperature range in which wafer distortions can occur, is cooled at the cooling rate of approximately 20° C./sec from the process temperature to 120° below the process temperature.

Furthermore, it is advantageous if the flushing step at the start of the recipe is reduced to an extent such that the chamber is still sufficiently flushed with process gas and the cooling step at the end of the recipe is reduced to an extent such that the exit temperature is 600° C., with the overall result that the process time is reduced.

BRIEF DESCRIPTION OF THE DRAWING

The invention will be explained in more detail below using an exemplary embodiment in connection with the FIGURE, a temperature profile for AA oxidation being illustrated in the associated FIGURE of the drawing.

DETAILED DESCRIPTION

The wafer is heated in a process chamber proceeding from room temperature R at a heating rate of 12° C./sec up to the stabilization step S, which is fixed at 120° C. below the process temperature P to be reached, that is to say at 1000° C. in the example. The time period of the stabilization step is a few seconds.

Further heating to the process temperature of 1120° C. us effected at a heating rate of 10° C./sec.

Raising the stabilization step to 120° C. below the process temperature and reducing the heating rates has the errors in the contact hole planes are at any rate eliminated by the method according to the invention. The consequence is a considerable improvement in the yield and a reduction of the DC yield losses by 7–10%, the outlay concerning the change of recipes of the RTP processes being very low.

What is claimed is:

1. A method for improving a thermal process step in the patterning of a semiconductor wafer, in which the wafer, in a process chamber, is heated to a process temperature at a predetermined heating rate and, after a selected process time has elapsed, is cooled at a predetermined cooling rate, wherein the wafer is heated at a heating rate of approximately 12° C./sec up to a stabilization step at a stabilization temperature of approximately 120 degrees below the process temperature, and then up to the process temperature at a heating rate of 10° C./sec and, after the process time has elapsed, is cooled down to room temperature at a predetermined low cooling rate.

2. The method as claimed in claim 1, wherein the thermal process step is a rapid thermal processing process during an oxidation.

3. The method as claimed in claim 2, wherein the stabilization temperature is 1000° C.

4. The method as claimed in claim 1, wherein the wafer is cooled at a cooling rate of approximately 20° C./sec.

5. The method as claimed in claim 4, wherein the wafer, at least in the temperature range in which wafer distortions can occur, is cooled at the cooling rate of approximately 20° C./sec from the process temperature to 120° below the process temperature and is then cooled at a lower cooling rate.

6. A method for controlling temperature of a semiconductor wafer in a process chamber, said method comprising:

heating said chamber from a starting temperature to a stabilizing temperature at a heating rate of approximately 12 degrees Celsius per second;

maintaining said chamber at said stabilizing temperature for a selected stabilization period;

heating said chamber from said stabilizing temperature to a process temperature at a heating rate of approximately 10 degrees Celsius per second;

maintaining said chamber at said process temperature for a selected processing period; and cooling said chamber from said process temperature to an exit temperature at a selected low cooling rate.

7. The method of claim 6, further comprising selecting said stabilizing temperature to be approximately 89 percent of said process temperature.

8. The method of claim 6, further comprising selecting said stabilizing temperature to be approximately 120 degrees Celsius below said process temperature.

9. The method of claim 8, further comprising selecting said stabilizing temperature to be approximately 1000 degrees Celsius.

10. The method of claim 6, wherein cooling said chamber comprises selecting said cooling rate to be approximately 20 degrees Celsius per second.

11. The method of claim 6, wherein cooling said chamber comprises cooling said chamber at a first cooling rate until said chamber is at a critical temperature above which wafer distortions can occur, and cooling said chamber at a second cooling rate between said critical temperature and an exit temperature, said second cooling rate being lower than said first cooling rate.

12. The method of claim 6, wherein cooling said chamber comprises selecting said exit temperature to be approximately 600 degrees Celsius.

13. The method of claim 6, further comprising shortening a flushing step to an extent such that said process chamber is sufficiently flushed with process gas.

* * * * *